(12) United States Patent
Vrankovic et al.

(10) Patent No.: US 8,593,150 B2
(45) Date of Patent: Nov. 26, 2013

(54) METHOD AND APPARATUS FOR DETECTING A LOCATION OF GROUND FAULTS IN A MOTOR/MOTOR DRIVE COMBINATION

(75) Inventors: Zoran V. Vrankovic, Greenfield, WI (US); Lixiang Wei, Whitefish Bay, WI (US); Gary L. Skibinski, Milwaukee, WI (US); Craig R. Winterhalter, Cedarburg, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 472 days.

(21) Appl. No.: 12/943,571

(22) Filed: Nov. 10, 2010

(65) Prior Publication Data

US 2012/0112757 A1    May 10, 2012

(51) Int. Cl.
    *G01R 31/14*         (2006.01)
(52) U.S. Cl.
    USPC ............................ 324/509; 324/510; 324/512

(58) Field of Classification Search
    None
    See application file for complete search history.

(56) References Cited

U.S. PATENT DOCUMENTS

| | | | |
|---|---|---|---|
| 2,137,878 A * | 11/1938 | Kramer | 324/120 |
| 2004/0212371 A1* | 10/2004 | Nomoto et al. | 324/522 |
| 2009/0184717 A1* | 7/2009 | Ivan et al. | 324/522 |
| 2010/0289439 A1* | 11/2010 | Kitanaka et al. | 318/400.26 |
| 2011/0153234 A1* | 6/2011 | Winterhalter et al. | 702/58 |

* cited by examiner

*Primary Examiner* — Vinh Nguyen
(74) *Attorney, Agent, or Firm* — R. Scott Speroff; Boyle Fredrickson S.C.; John M. Miller (57) ABSTRACT

A motor drive system provides for analysis of current flow in the DC bus to identify ground faults and their locations. Low-frequency positive polarity and negative polarity current differences indicate ground faults from the positive DC bus and negative DC bus respectively. High-frequency signals indicate ground faults in the motor windings and connecting leads.

20 Claims, 6 Drawing Sheets

METHOD AND APPARATUS FOR DETECTING A LOCATION OF GROUND FAULTS IN A MOTOR/MOTOR DRIVE COMBINATION

BACKGROUND OF THE INVENTION

The present invention relates to motor drives and in particular to a ground fault detection system identifying locations of ground faults in motor drive systems.

Motor drive systems provide control of power applied to a motor for improved motor control and efficiency. Generally, such systems receive a source of alternating current (AC) which is rectified to provide a direct current (DC) bus. The DC voltage of the bus is then received by an inverter which synthesizes new AC waveforms to be applied to the motor. The new waveforms, for example, may provide a variable control frequency for regulating the speed of the motor or for controlling its torque or dynamic characteristics such as startup and slowdown.

The circuitry of the motor drives and the windings of motors attached to the motor drives are typically each enclosed in grounded metal housings. Should a powered conductor of either break free and contact the housing, the power of the conductor is safely shunted to ground. Such failures are called "ground faults".

Ground faults in high-powered equipment can produce high current flow into ground of a magnitude that can damage the equipment or present other hazards. This ground fault current can be limited by using high resistance ground connections in which a series resistor is placed in the ground path to limit current flow. Such high resistance grounding can in many cases permit continued operation of the equipment during a ground fault. By the same token high resistance grounding can make it difficult to determine that a ground fault has occurred and/or to pinpoint the particular device having a ground fault. Even when the particular motor drive affected is identified, it may be difficult or impossible to determine the location of the ground fault and the appropriate response.

SUMMARY OF THE INVENTION

The present invention provides a ground fault detection system that may detect ground faults when there is high resistance grounding and which may further identify the location of the ground fault not only with respect to the particular drive affected, but also with respect to a particular side of the DC bus of the motor drive and/or between the motor drive and the wiring to, or windings of, the motor itself or in the AC bus to which the drive is attached. These latter distinctions can permit improved decision-making about remedial steps and increase the speed with which equipment can be repaired.

Specifically then, one embodiment of the present invention provides a motor drive for providing power to an electric motor. The motor drive includes an input for receiving a source of DC bus voltage on at least one positive and one negative bus conductor and an inverter receiving power from DC bus voltage from the bus conductors to synthesize an AC waveform to drive electric motor. The motor drive may include a first and second current sensor communicating with the positive and negative bus conductor respectively to sense current in these conductors and a fault detection circuit receiving current signals from the first and second current sensor to analyze the current signals and to provide an output distinguishing a location of a ground fault with respect to portions of the motor drive.

It is thus a feature of at least one embodiment of the invention to permit rapid localization of ground faults that may or may not cause failure of the motor drive or motor.

The identified fault locations may distinguish ground faults on the positive and negative bus conductors.

It is thus a feature of at least one embodiment of the invention to permit improved repair in diagnosis of the motor drive itself.

The identified fault locations may distinguish between the bus conductors and conductors of the motor including connections between the motor and output of the inverter.

It is thus a feature of at least one embodiment of the invention to quickly identify ground faults outside of the motor drive.

The current sensors may be windings on choke coils on at least one positive and one negative bus conductor.

It is thus a feature of at least one embodiment of the invention to integrate current sensors into pre-existing choke structures.

The motor drive may contain choke coils to provide a continuous magnetic circuit.

It is thus a feature of at least one embodiment of the invention to provide a compact current sensing structure that is more sensitive to current imbalances.

The fault detection circuitry may determine a frequency of a difference between the current signals to distinguish a location of the ground fault between the bus conductor and conductor leading to and internal to the motor.

It is thus a feature of at least one embodiment of the invention to exploit frequency information in a ground fault signal that may be used to localize the ground fault in a motor drive.

The fault detection circuitry may determine a polarity of a difference between the current signals to distinguish the location of the ground fault between the positive and negative bus conductor.

It is thus a feature of at least one embodiment of the invention to exploit ground fault polarity to locate the ground fault within the motor drive.

The fault detection circuitry may determine a magnitude of the difference between the current signals to detect ground faults from 2 to 5 amperes flowing through high resistance grounds.

It is thus a feature of at least one embodiment of the invention to permit rapid and precise identification of ground faults in high resistance grounds systems.

The motor drive may further include a rectifier receiving three-phase electricity on corresponding AC lines to provide the source of DC bus voltage and at least one additional current sensor may be provided to sense current imbalance through AC lines associated with a drive. A second fault detection circuit may receive the current signals from the additional current sensor to analyze the current signals and to provide an output distinguishing a location of a ground fault on an AC line.

It is thus a feature of at least one embodiment of the invention to permit identification of ground faults leading to the motor drives in addition to internal and motor related ground faults.

These particular objects and advantages may apply to only some embodiments falling within the claims and thus do not define the scope of the invention.

DETAILED DESCRIPTION OF THE PREFERRED EMBODIMENT

Figure 1:
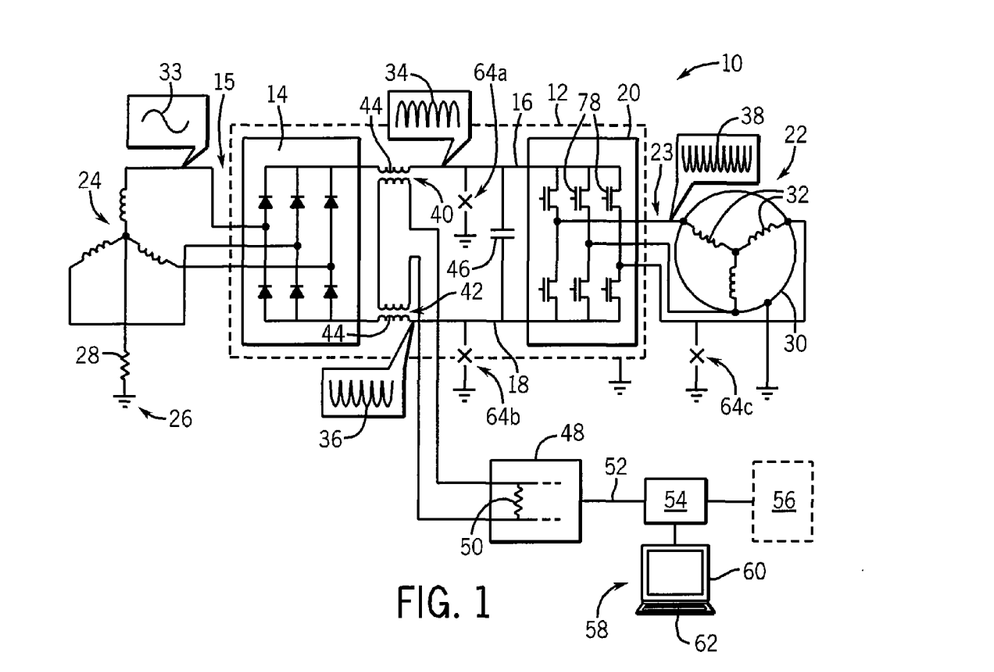
FIG. 1 is a simplified schematic of a motor drive system including a motor drive and motor and a ground fault detection system of the present invention.

Referring now to FIG. 1, a motor drive system 10 per the present invention may provide for a housing 12 holding a rectifier unit 14 receiving, for example, three phase power 15 over three input leads 17. The rectifier unit 14 outputs DC power on a positive DC bus conductor 16 and a negative DC bus conductor 18. The DC bus conductors 16 and 18 are then received by an inverter 20 which, under the control of a motor control circuit (not shown), synthesizes new three phase power 23 provided to a motor 22 over three output leads.

An outer casing 30 of the motor 22 and the housing 12 may be conductive and connected to ground 26 so as to provide a safe path of conduction of ground fault currents, for example, caused by dislodgment of powered internal motor windings 32 that contact the casing 30 or powered conductors inside the motor drive systems 10 that short-circuit to the housing 12.

The magnitude of such ground fault currents may be limited by a series resistance 28, connected between the three phase power 15 and ground 26. For example, when the three phase power 15 is from a Y connected transformer or generator 24, the resistance 28 may be placed between the common connection of the generator or transformer windings and ground 26. Such a resistance may be selected to limit ground fault currents to a range of 1-10 amperes and will typically be on the order of 27~277 ohms for 480V system. The resistance 28 may in certain circumstances permit desired continued operation of the motor drive system 10 in a ground fault condition but in doing so complicates identification and location of the ground fault.

Current flow through the positive and negative DC bus conductors 16 and 18 may be monitored by magnetic coupling windings 40 and 42, respectively, which in the simplest embodiment may be current transformers possibly integrated with chokes 44 which, together with capacitance 46 shunting the positive DC bus conductor 16 and negative DC bus conductor 18, provide filtration of the voltage on the DC bus conductors 16 and 18 reducing the voltage ripple. The magnetic coupling winding 40 and 42 will be described further below and may also include other well-known current sensing devices including current transformers and Hall effect sensors.

Signals from the magnetic coupling winding 40 and 42 are provided to ground fault processing circuitry 48 which monitors those currents to detect the ground fault and to analyze the location of the ground fault as will be described below. When the magnetic coupling winding 40 and 42 are transformer windings as depicted, they may be connected in series and applied across a resistance 50 in the ground fault processing circuitry 48, a voltage across which will be proportional to a difference between the current flow in the positive DC bus conductor 16 and the current flow in the negative DC bus conductor 18. As is generally understood in the art, a difference between these current flows indicates a ground fault in which current is not returning to the DC bus but flowing instead to ground.

The ground fault processing circuitry 48 which may be part of or incorporated into the control circuitry driving the inverter 20 (and hence within housing 12) may provide for a network connection 52 or other similar connection to industrial controller 54. In the industrial controller 54, for example a programmable logic controller of the type manufactured by Rockwell Automation, Inc., may provide for the control of an industrial process 56 through a contained control program receiving signals from the industrial process 56 and providing signals to the industrial process 56 according to the stored control program and by the agency of one or more I/O modules (not shown).

The industrial controller 54 may communicate with one or more human machine interfaces 58 providing for human readable graphic displays 60 and input devices 62 for communication with human operators. The graphics display 60 may provide a message or diagram indicating the existence of a ground fault, a magnitude or range of the ground fault currents, and a location of the ground fault according to techniques that will be described below.

Referring still to FIG. 1, the three phase power 15 will provide for sinusoidal currents 33 at a relatively low frequency, for example 60 Hz, in three separate phases separated by 120°. This three phase power 15 is received by the rectifier unit 14 which provides for standard bridge rectification of the three phase power 15 to provide positive-going rectified DC 34 on the positive DC bus conductor 16 and negative-going rectified DC 36 on the negative DC bus conductor 18. The rectification process will generally triple the fundamental frequency of the three phase power 15 to approximately 180 Hz. The rectified DC 34 and 36 is provided to the inverter 20 which produces synthesized three phase power 23 comprised of three phases of voltage 38, each generally a much higher frequency than the rectified DC 34 and 36 as a result of both a pulse width modulation effected by the inverter 20 and possibly high-frequency operation of the motor 22 and/or injected high-frequency sensing currents.

Figure 2:
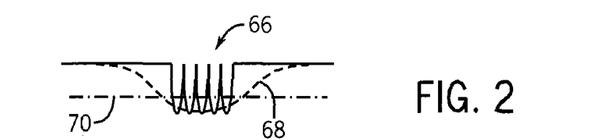
FIG. 2 is a first waveform receivable by the ground fault detection system indicating a ground fault on the positive bus conductor.

Referring to FIGS. 1 and 2, a first ground fault 64a may occur within the housing 12 between the positive DC bus conductor 16 and ground 26, for example, as a result of a failed component shortening the positive DC bus conductor 16 to ground or broken bus conductor touching the housing 12. This ground fault 64a, occurring after magnetic coupling winding 40 with respect to the rectifier unit 14, will increase the current flow through magnetic coupling winding 40 but not equally increase the current returning through magnetic coupling winding 42 because the ground fault current is conducted not through the motor 22 but instead directly to ground 26. The resulting signal 66 across resistance 50 as depicted in FIG. 2 will exhibit a DC offset 68, that is an average voltage that is not equal to zero or ground voltage. The polarity of the DC offset 68 will be determined by the particular orientation of the windings of the magnetic coupling winding 40 and 42 and the interconnection of the magnetic coupling winding 40 and 42 to the resistance 50. In the example depicted, ground fault 64a provides negative DC offset 68 indicating a ground fault on the positive DC bus conductor 16. The signal 66 will have the fundamental frequency associated with the frequencies of the rectified DC 34 on the DC bus conductors 16 and 18 (e.g. 180 hertz) and thus may be identified to the DC bus conductors 16 or 18. Together this information of polarity and frequency indicates that the ground fault 64a is on the positive DC bus conductor 16.

Referring still to FIG. 2, the ground fault processing circuitry 48 may provide for an internal threshold 70 to which this signal 66 may be compared and so that when the signal 66 crosses the threshold 70 a ground fault is indicated. This threshold 70 may be set sufficiently low as to detect 2 to 5 ampere current flows associated with ground faults in a system having high impedance grounds.

Figure 3:
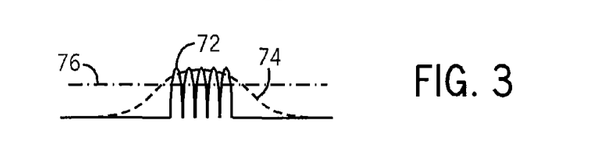
FIG. 3 is a figure similar to that of FIG. 2 of a second waveform indicating a ground fault on the negative bus conductor.

Alternatively, and referring to FIGS. 1 and 3, a ground fault 64b may occur between the negative DC bus conductor 18 and ground 26 which will cause a greater current flow in the negative DC bus conductor 18 than in the positive DC bus conductor 16. This imbalance in turn will produce a signal 72 at resistance 50 having, in this example, a positive DC offset 74. When this signal crosses threshold 76, a ground fault may be indicated and identified generally to the DC bus conductors 16 and 18 by its frequency, and specifically to negative DC bus conductor 18 by the polarity of the DC offset 74. Again the threshold 76 may be set to provide a desired sensitivity to low fault low currents to high resistance grounds.

Figure 4:
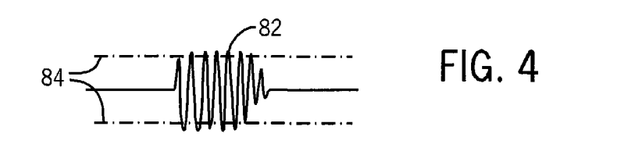
FIG. 4 is a figure similar to that of FIG. 2 of the third waveform indicating a ground fault in a motor winding or the connecting leads thereto.

Referring now to FIGS. 1 and 4, alternatively, a ground fault 64c may occur between a conductor connected to the output of the inverter 20 and ground 26. This conductor may be either a connecting lead to the motor 22 or an internal winding 32 of the motor 22. As before, this ground fault 64c will also provide an imbalance in the currents between the positive DC bus conductor 16 and the negative DC bus conductor 18 producing a signal 82 after resistance 50. This signal 82 will be bipolar, having a polarity that alternately looks like a ground fault on positive DC bus conductor 16 and a ground fault on negative DC bus conductor 18 depending on the particular one of switching transistors 78 that is in a conducting state. Because this ground fault will provide a current path avoiding an inductance of the motor windings 32, the frequency of the pulse width modulation of the inverter 20 may be readily detected in a signal 82 at resistance 50. This high frequency will permit identification of the signal 82 to ground fault 64c outside of the motor drive. Detection of the ground fault may be provided by the use of two thresholds 84 having symmetrical negative and positive offsets of any level that provides for the detection of ground faults at relatively low current values of 2-5 amperes. It will be understood that generally all of these thresholds may be adjusted for comparable operation in low impedance grounds situations.

Figure 7:
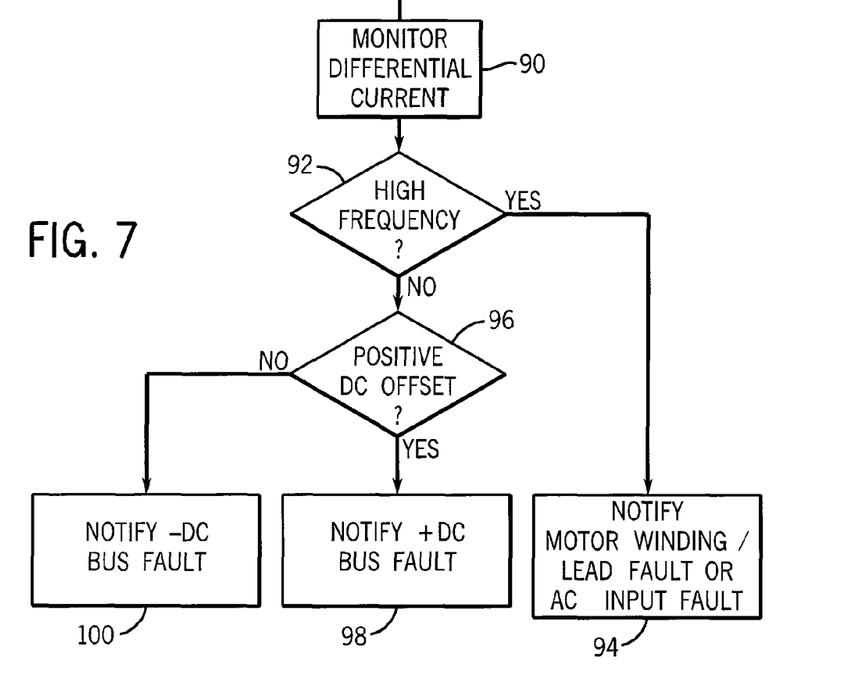
FIG. 7 is a flow chart of the steps implemented either in discrete circuitry or in a controller program in the ground fault detection system for distinguishing the location of the ground fault.

Referring now to FIG. 7, in summary, the ground fault processing circuitry 48 implements a number of different steps in identifying a ground fault and its location. These steps may be implemented through discrete circuitry or using an electronic computer executing a stored program and reading a digitized value of the voltage value on resistance 50 or the like. Alternatively, separate signals from each of the magnetic coupling winding 40 and 42 may be digitized and internally subtracted or otherwise processed to provide a comparable analysis.

In all cases, the analysis begins with a functional step as indicated by process block 90 of a measurement and determination of the differential current through the positive DC bus conductor 16 and the negative DC bus conductor 18. If an AC current of a give magnitude is detected, indicating an imbalance, the DC offset (average value) of this AC current may be evaluated at decision block 92 and if there is no DC offset, the step of process block 94 may be undertaken to cause a notification of the controller 54 that that there is a ground fault of the particular magnitude (for example, determined by a comparator or by an executed mathematical operation) being either a motor winding 32 or connecting lead to the motor 22.

Alternatively at decision block 92, the offset of the AC signal may be determined to be non-zero, for example. In this case, the polarity of the DC offset voltage is determined at process block 96. If there is a positive DC offset above a predetermined threshold described above, then at process block 98 a notification is made to the controller 54 indicating a ground fault on the negative DC bus conductor 18. Conversely if there is a negative DC offset below the predetermined threshold, then at process block 100 a notification is provided to the controller 54 indicating a ground fault on the positive DC bus conductor 16. In one embodiment the current level of the fault may also be indicated.

It will be understood that the relative polarities and frequencies used for decision blocks 92 and 96 may be readily adjusted for different implementations.

Figure 5:
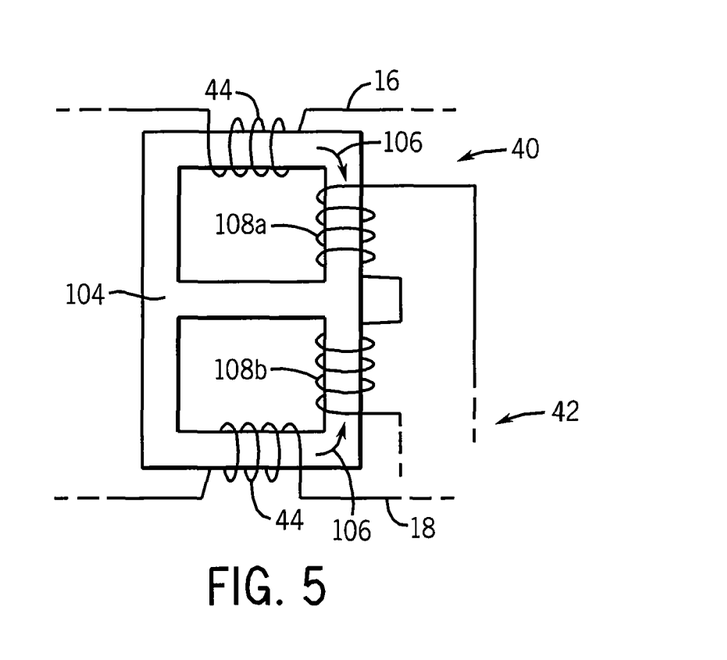
FIG. 5 is a simplified representation of current sensors used to provide the signals of FIGS. 2-4 as integrated into the bus choke.

Referring now to FIG. 5, in one embodiment the current sensor may provide for continuous magnetic core 104 providing a "figure-8" configuration in which the chokes 44 for the positive DC bus conductor 16 and negative DC bus conductor 18 are wound on different loops of the "8" to provide for counter-cyclic magnetic fields 106. These magnetic fields are received by magnetic coupling winding 108a (for magnetic coupling winding 40) and magnetic coupling winding 108b (for magnetic coupling winding 42) and are wound on the same loops of the "8" as respective chokes 44 but wound in opposite directions so that during normal balanced current flows between positive DC bus conductor 16 and negative DC bus conductor 18, the series connected magnetic coupling winding 108a and 108b provide canceling voltages to produce zero current and hence a zero voltage across measurement resistance 50. In contrast, imbalances between the current flowing through positive DC bus conductor 16 and negative DC bus conductor 18 produce an imbalance in the voltages of magnetic coupling winding 108a and 108b providing the voltages that create the signals of 66, 72 and 82 described above with respect to FIGS. 2-4.

Figure 6:
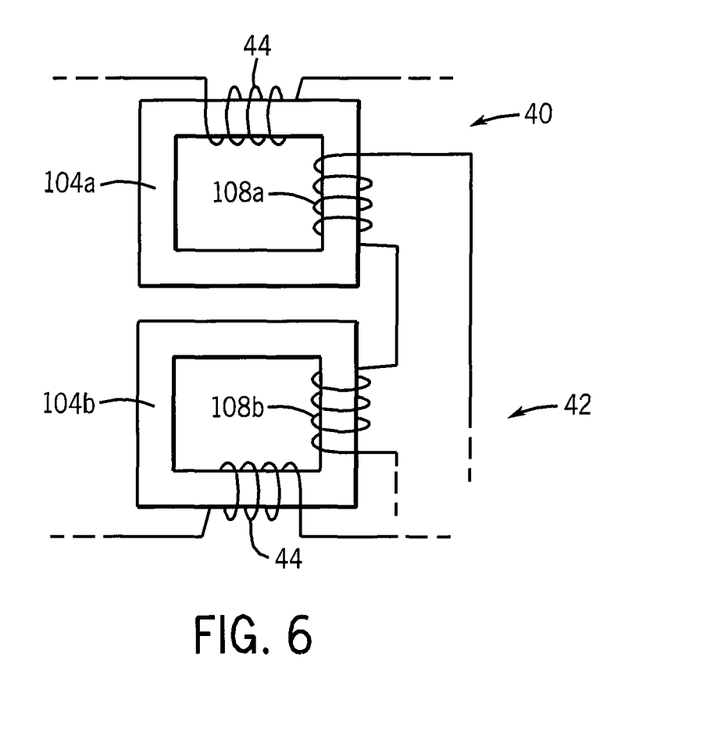
FIG. 6 is a figure similar to that of FIG. 5 showing an alternative embodiment of the current sensors employing two separate current transformers.

Referring now to FIG. 6, it will be understood that a similar sensing may be obtained when the core 104 is broken into two separate ring coils 104a and 104b as shown.

Figure 8:
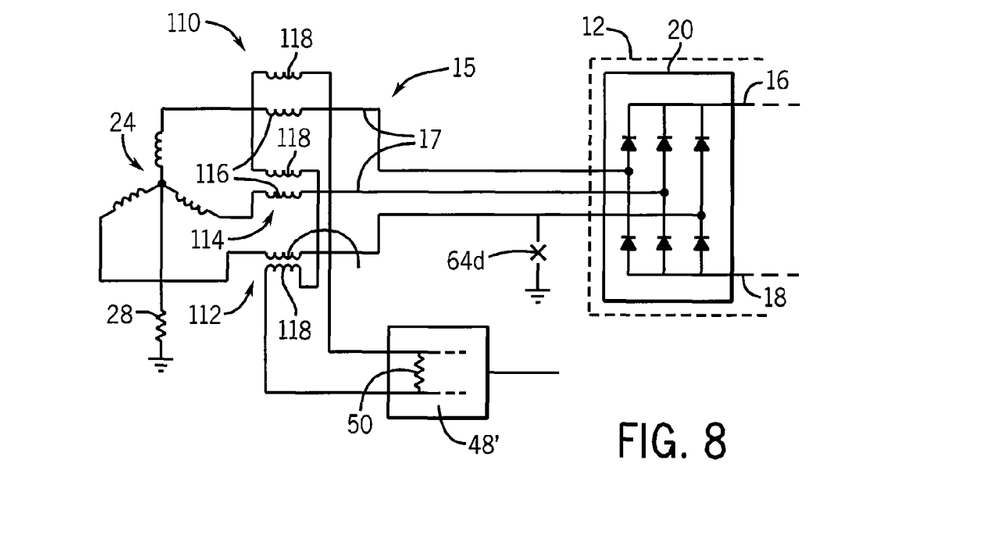
FIG. 8 is a fragmentary figure similar to that of FIG. 1 showing the installation of current sensors between the source of AC power and the inverter of the motor drive.

Referring now to FIG. 8, ground faults 64d, for example, occurring in one of the input leads 17 for the three phase power 15, may be detected by the placement of one or more magnetic coupling winding on the generator or transformer side of the ground fault 64d in series with each lead 17 so as to monitor imbalances in the different phases of power on leads 17. As depicted in FIG. 8, three current sensors 110, 112 and 114 may be used for this purpose and their signals combined to provide a current across resistance 50 of ground fault processing circuitry 48' (which may be separate or combined in part with ground fault processing circuitry 48 described above).

Figure 9:
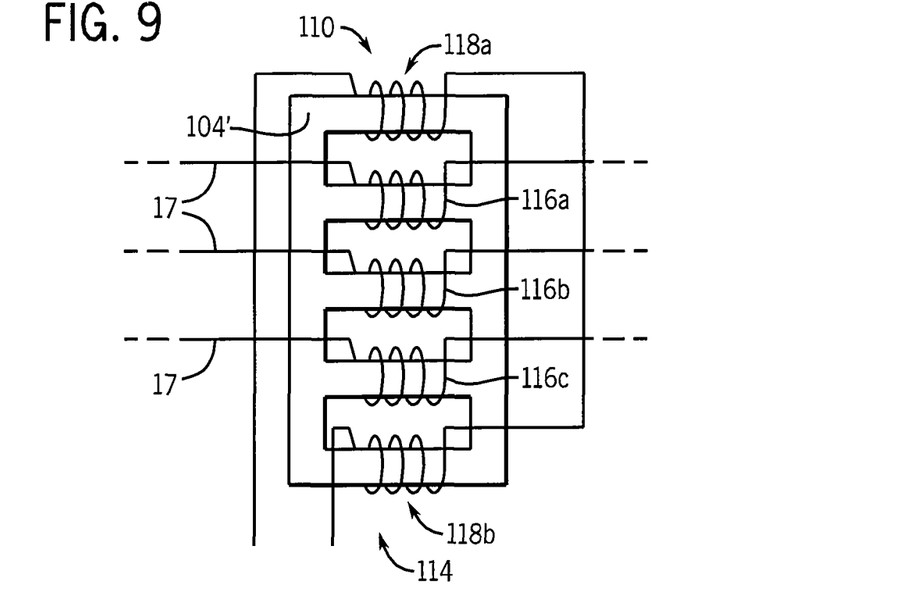
FIG. 9 is a figure similar to that of FIG. 5 showing a simplified representation of the current sensors used in FIG. 8.

Referring now to FIG. 9, the current sensors 110, 112 and 114 may be implemented on a unified core 104' as shown, for example, having five parallel legs extending between two parallel core plates perpendicular to the legs. The center three legs may each have wound around them one primary winding 116a-116c in series with the leads 17 and the outer two legs may each support one secondary winding providing magnetic coupling windings 118a and 118b. Magnetic coupling windings 118a-118b are, in turn, series connected to provide the current signals to the resistance 50. Optionally, the ground fault processing circuitry 48' will only detect ground faults in the leads 17 which produce a signal 120 having a frequency of approximately line frequency and no DC offset.

Figure 10A:
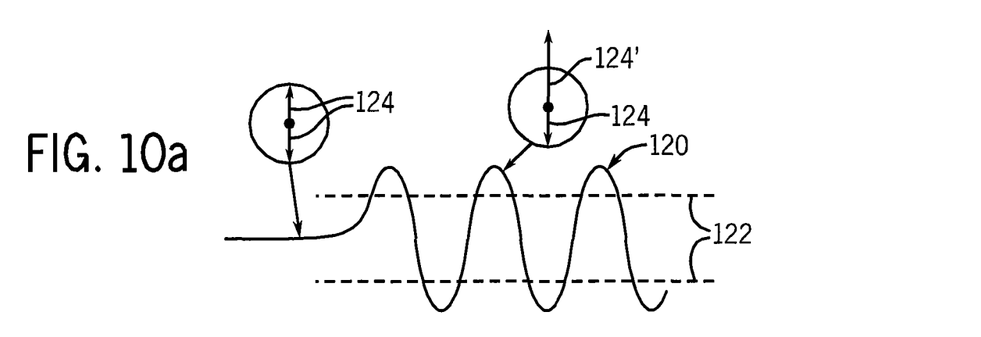
FIGS. 10a and 10b are figures similar to that of FIG. 2 showing a waveform receivable by the ground fault detection system indicating a ground fault on the AC input per the embodiments of FIGS. 9 and 12a respectively.

Referring momentarily to FIG. 10a, during normal operation each of the current signals 124 from the sensors 110 and 112 will have a phase such as to provide for two canceling phasers at 180° spacing and summing together to produce a signal 120 having zero amplitude. Ground fault 64d will increase one current signal 124' representing the current flow in one phase so this cancellation does not occur and the signal 120 rises in amplitude past a threshold 122 that may be detected by a ground fault processing circuitry 48' which then notifies the controller 54 that there has been a ground fault located somewhere in the leads 17 in a manner similar to that described above.

Figure 12A:
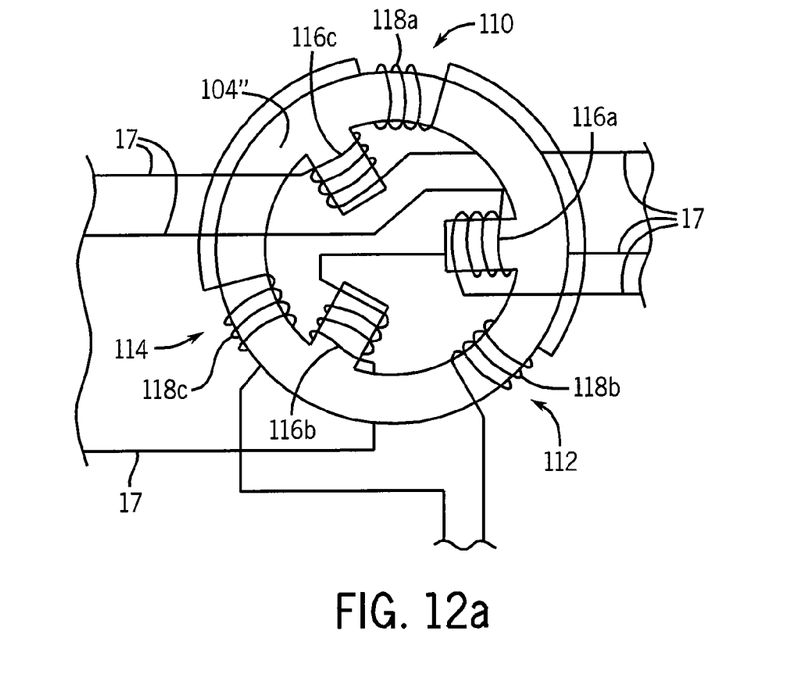
FIGS. 12a and 12b are alternative designs of the current sensor of FIG. 9.

Referring now to FIG. 12a, in an alternative embodiment, the core 104" may comprise a single iron or ferrite ring having three radially inwardly extending cantilevered tabs equally spaced along the inner diameter of the ring. Each of the lead to 17 may be wound around one of the tabs to provide the primary windings 116a-c. Magnetic coupling windings 118a-c may be wound around the ring between the tabs to provide current sensors 110, 112, and 114. The magnetic coupling windings 118 may be connected in series to provide a mutually canceling voltage when the current is balanced in each of the leads 17.

Figure 10B:
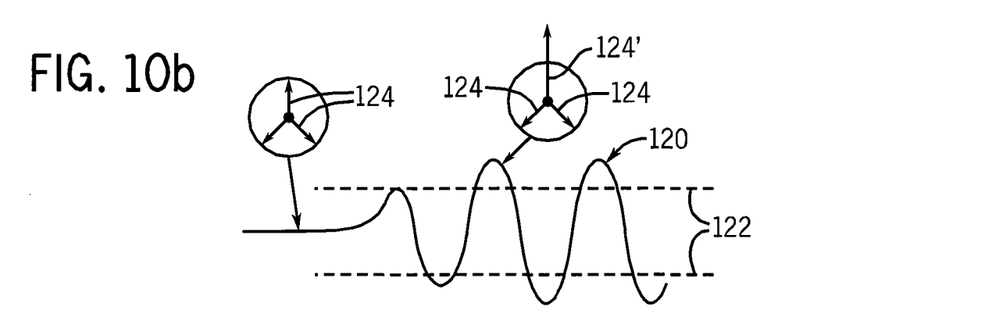

Referring momentarily to FIG. 10b, during normal operation each of the current signals 124 from the sensors 110, 112 and 114 will have a phase such as to provide for three canceling phasers at 120° relative spacing summing together to produce a signal 120 having zero amplitude. Ground fault 64d will increase one current signal 124' representing the current flow in one phase so this cancellation does not occur and the signal 120 rises in amplitude past a threshold 122 that may be detected by a ground fault processing circuitry 48' which then notifies the controller 54 that there has been a ground fault located somewhere in the leads 17 in a manner similar to that described above.

Figure 12B:
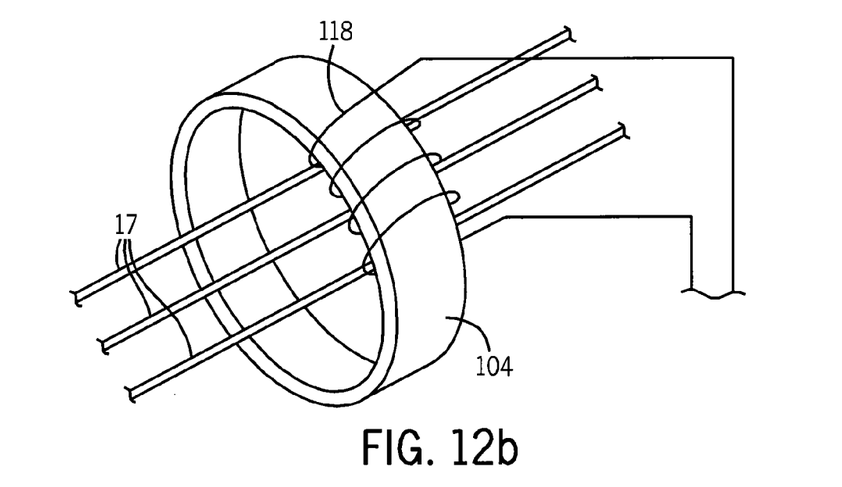

Referring now to FIG. 12b, in yet a further alternative design, the core 104''' may be a single ring with the conductors 17 passing through its center and each forming a zero turn primary winding 116. A single magnetic coupling winding 118 maybe wound around a wall of the ring to provide a signal across resistor 50. This signal will naturally represent the summation of three phasers 124 per FIG. 10b.

Figure 11:
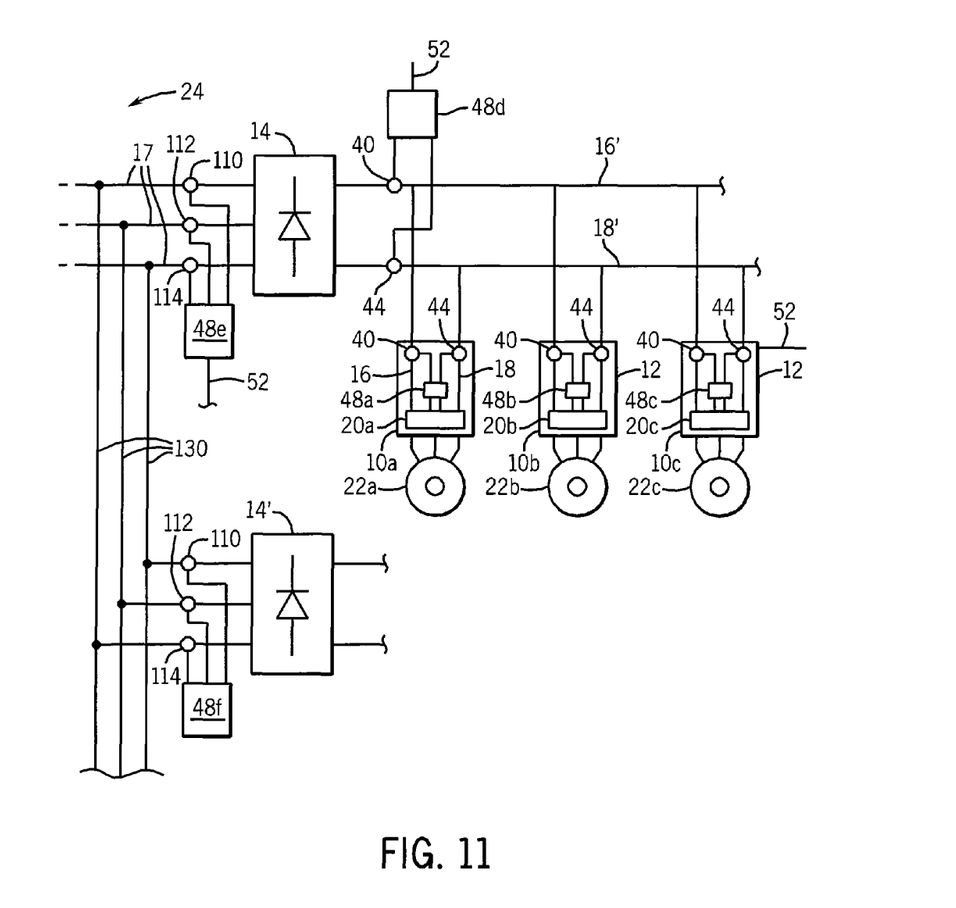
FIG. 11 is a figure similar to that of FIG. 1 showing an alternative motor drive system having a shared DC bus and a shared AC bus.

Referring now to FIG. 11, it will be understood that the present invention may also work with the set of motor drives 10a-10c that shares a common rectifier unit 14 but provides for separate inverters 20a-20c each in a different housing 12 and each associated with different motors 22a-22c. In this case, the magnetic coupling winding 40 and 42 of each motor drive 10a-10c may be placed within the housings 12 near the point of entry of DC power from the common rectifier unit 14. These magnetic coupling winding 40 and 42 may thus detect ground faults in the particular motor drives 10a-10c identified to a particular motor drive 10a-10c and distinguished among the portion of the positive and negative DC busses internal to motor drives 10a-10c related to ground faults 64a and 64b as described above. Further, the magnetic coupling winding 40 and 42 may detect ground faults located in the respective motors 22a-22c associated with these motor drives 10a-10c and identify them as such.

Ground faults on shared portions of the DC bus conductors 16' and 18' common to each of the motor drives 10a-10c may optionally be detected by additional magnetic coupling winding 40 and 42 on the output of the rectifier unit 14 associated with an independent ground fault processing circuitry 48d. In this way ground faults may be detected with respect to each individual drive 10a and 10c as well as before the motor drives 10a-10c on the common portions of the DC bus conductors 16' and 18'.

Ground faults on the leads 17 common to each of the motor drives 10a-10c may be detected by various numbers of current sensors 110, 112, and 114 as described above.

Referring still to FIG. 11, it will be understood that the present invention may be used with a common AC bus 130, with each tap on the AC bus 130, as connects to a rectifier unit 14 or 14', being monitored by various current sensors 110-114 or subsets of the sensors Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference, which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

References to "a microprocessor" and "a processor" or "the microprocessor" and "the processor," can be understood to include one or more microprocessors that can communicate in a stand-alone and/or a distributed environment(s), and can thus be configured to communicate via wired or wireless communications with other processors, where such one or more processor can be configured to operate on one or more processor-controlled devices that can be similar or different devices. Furthermore, references to memory, unless otherwise specified, can include one or more processor-readable and accessible memory elements and/or components that can be internal to the processor-controlled device, external to the processor-controlled device, and can be accessed via a wired or wireless network.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications, are hereby incorporated herein by reference in their entireties.

What we claim is:

1. A motor drive for providing power to an electric motor having a motor housing connected to a ground, the motor drive comprising:
   an input for receiving a source of DC bus voltage on at least one positive and one negative bus conductor;
   a drive housing connected to the ground and in communication via a current pathway with the input;
   an inverter receiving at least one positive and one negative bus conductor to synthesize an AC waveform connectable at an output of the inverter to the electric motor for driving a same;
   a first and second current sensor communicating with the positive and negative bus conductors respectively to sense current therethrough;
   a fault detection circuit receiving current signals from the first and second current sensors to analyze the current signals and to provide an output distinguishing a location of a ground fault with respect to portions of the motor drive, the ground fault providing current flow through the current pathway from at least one of the bus conductors and the motor, the fault detection circuit further providing a notification to as user indicating the location of the ground fault.

2. The motor drive of claim 1 wherein the portions are selected from the positive and negative bus conductor.

3. The motor drive of claim 1 wherein the portions are selected from at least one bus conductor and a group of conductors of the motor and connections between the motor and the output of the inverter.

4. The motor drive of claim 1 wherein the current sensors are windings on choke coils on at least one positive and one negative bus conductor.

5. The motor drive of claim 4 wherein the choke coils provide a continuous magnetic circuit.

6. The motor drive of claim 3 wherein the fault detection circuitry determines a frequency of a difference between the current signals to distinguish a location of the ground fault between the group consisting of: (1) at least one bus conductor and (2) a group of conductors of the motor and connections between the motor and the output of the inverter.

7. The motor drive of claim 1 wherein the fault detection circuitry determines a polarity of a difference between the current signals to distinguish the location of the ground fault between the positive and negative bus conductor.

8. The motor drive of claim 1 wherein the fault detection circuitry determines a magnitude of a difference between the current signals to detect ground faults from 2 to 5 amperes.

9. The motor drive of claim 1 wherein the output is communicated to a user terminal to provide a graphic display of a location of a ground fault.

10. The motor drive of claim 1 further including a rectifier receiving three-phase electricity on corresponding AC lines to provide the source of DC bus voltage;
    further including at least one additional current sensor sensing current through at least one AC line associated with at least one phase; and
    a second fault detection circuit receiving current signals from the at least one additional current sensor to analyze the current signals and to provide an output distinguishing a location of a ground fault on an AC line.

11. A method for identifying a location of a ground fault in a motor drive of a type providing power to an electric motor, the electric motor having a motor housing connected to a ground, the motor drive having an input for receiving a source of DC bus voltage on at least one positive and one negative bus conductor and an inverter receiving at least one positive and one negative bus conductor to synthesize an AC waveform connectable at an output of the inverter to the electric motor for driving a same, the motor drive further including a drive housing connected to the ground and in communication via a current path with the input, the method comprising the steps of:
    (a) measuring current on the positive and negative bus conductors;
    (b) analyzing the measured current to detect a ground fault providing current flow through the current pathway from at least one of the bus conductors and the motor; and
    (c) when a ground fault is detected, analyzing the measured current to provide an output to a user distinguishing a location of a ground fault with respect to different portions of the motor drive.

12. The method of claim 11 wherein the portions are selected from the positive and negative bus conductors.

13. The method of claim 11 wherein the portions are selected from at least one bus conductor and a group of conductors of the motor and connections between the motor and the output of the inverter.

14. The method of claim 13 wherein the analysis of step (c) determines a frequency of a difference between the current signals to distinguish a location of the ground fault between the group consisting of: (1) at least one bus conductor and (2) a group of conductors of the motor and connections between the motor and the output of the inverter.

15. The method of claim 11 wherein the analysis of step (c) determines a polarity of a difference between the current signals to distinguish the location of the ground fault between the positive and negative bus conductor.

16. The method of claim 11 wherein the analysis of step (b) determines a magnitude of a difference between the current signals to detect ground faults from 2 to 5 amperes.

17. The method of claim 11 including the step of communicating the output to a user terminal to provide a graphic display of a location of a ground fault.

18. The method of claim 11 wherein the motor drive further includes a rectifier receiving three-phase electricity on corresponding AC lines to provide the source of DC bus voltage, the method further including the steps of:
    (d) measuring current through AC lines associated with each AC line; and
    (e) analyzing the measured current at (d) to detect a ground fault on an AC line.

19. A motor drive system providing power to an electric motor and having an input for receiving a source of DC bus voltage on at least one positive and one negative bus conductor, an inverter receiving at least one positive and one negative bus conductor to synthesize an AC waveform connectable at an output of the inverter to the electric motor for driving the same, and a drive housing connected to the ground and in communication via a current pathway with the input, the motor drive executing program steps of:

(a) measuring current on the positive and negative bus conductor;
(b) analyzing the measured current to detect a ground fault, the ground fault providing current flow through the current pathway from at least one of the bus conductors and the motor, the fault detection circuit further providing a notification to a user indicating the location of the ground fault;
(c) when a ground fault is detected, analyzing the measured current to provide an output distinguishing a location of a ground fault with respect to different portions of the motor drive; and
(d) outputting an identification of a ground fault to a particular location to a human machine interface.

20. The motor drive of claim 19 wherein the portions are selected from the positive bus conductor, the negative bus conductor, and connections between the motor and the output of the inverter.

\* \* \* \* \*